(12) United States Patent
Chung et al.

(10) Patent No.: US 7,372,438 B2
(45) Date of Patent: May 13, 2008

(54) ELECTROLUMINESCENT DISPLAY

(75) Inventors: Bo-Yong Chung, Suwon-si (KR); Wong-Sik Choi, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 564 days.

(21) Appl. No.: 10/992,358

(22) Filed: Nov. 19, 2004

(65) Prior Publication Data
US 2005/0104530 A1    May 19, 2005

(30) Foreign Application Priority Data
Nov. 19, 2003   (KR) ............... 10-2003-0082391

(51) Int. Cl.
*G09G 3/30* (2006.01)
(52) U.S. Cl. .................... 345/76; 345/78
(58) Field of Classification Search .......... 345/55, 345/76, 84, 204, 211, 82, 100, 92, 87, 78, 345/74.1, 75.1, 75.2, 90; 315/169.1–169.3; 349/149; 324/754, 72, 649; 313/506; 257/448, 257/394
See application file for complete search history.

(56) References Cited

U.S. PATENT DOCUMENTS

| | | | | |
|---|---|---|---|---|
| 5,256,960 | A * | 10/1993 | Novini | 324/72 |
| 6,144,080 | A * | 11/2000 | Wada et al. | 257/394 |
| 6,501,466 | B1 * | 12/2002 | Yamagishi et al. | 345/204 |
| 6,756,790 | B2 * | 6/2004 | Yakabe et al. | 324/649 |
| 6,762,738 | B2 * | 7/2004 | Frazee et al. | 345/90 |
| 6,771,249 | B1 * | 8/2004 | Hush et al. | 345/100 |
| 6,876,345 | B2 * | 4/2005 | Akimoto et al. | 345/76 |
| 6,995,734 | B2 * | 2/2006 | Moon | 345/55 |
| 6,995,757 | B2 * | 2/2006 | Okumura et al. | 345/204 |
| 7,015,882 | B2 * | 3/2006 | Yumoto | 345/76 |
| 7,126,568 | B2 * | 10/2006 | LeChevalier | 345/84 |
| 7,180,513 | B2 * | 2/2007 | Tsuge | 345/211 |
| 7,250,928 | B2 * | 7/2007 | Yamazaki et al. | 345/76 |
| 2001/0022572 | A1 * | 9/2001 | Murade | 345/98 |

(Continued)

FOREIGN PATENT DOCUMENTS

JP    62-252964    11/1987

(Continued)

OTHER PUBLICATIONS

Korean Office Action for Korean Patent Application No. 2003-82391 issued on Mar. 17, 2006.

(Continued)

*Primary Examiner*—Prabodh Dharia
(74) *Attorney, Agent, or Firm*—Robert E. Bushnell, Esq.

(57) ABSTRACT

An electroluminescent display includes: a pixel region including devices arranged therein and adapted to emit light in response to a data signal; a scan driver adapted to supply a switching signal to a gate electrode of a first switching device; a data driver adapted to supply data information to a source electrode of the first switching device; a conductive power supply line adapted to supply a first power supply voltage to the pixel region, and an electromagnetic shield adapted to shield electromagnetic waves having electric or magnetic field characteristics. The electromagnetic shield is adapted to generate a second power supply voltage having a polarity opposite to that of the first power supply voltage.

10 Claims, 5 Drawing Sheets

U.S. PATENT DOCUMENTS

| | | |
|---|---|---|
| 2001/0055085 A1 | 12/2001 | Jinno et al. |
| 2002/0047176 A1* | 4/2002 | Takahashi .................. 257/448 |
| 2004/0041761 A1* | 3/2004 | Sugita et al. ................. 345/87 |
| 2004/0207615 A1* | 10/2004 | Yumoto ...................... 345/211 |
| 2006/0077198 A1* | 4/2006 | Okumura et al. .......... 345/204 |

FOREIGN PATENT DOCUMENTS

| | | |
|---|---|---|
| JP | 9-269846 | 10/1997 |
| JP | 11-101986 | 4/1999 |
| JP | 11-202367 | 7/1999 |
| JP | 11-251779 | 9/1999 |
| JP | 2000-48952 | 2/2000 |
| JP | 2000-86992 | 3/2000 |
| JP | 2001-100233 | 4/2001 |
| JP | 2001-109395 | 4/2001 |
| JP | 2002-040961 | 2/2002 |
| JP | 2002-49330 | 2/2002 |
| JP | 2003-271075 | 9/2003 |
| WO | WO 03/060858 | 7/2003 |

OTHER PUBLICATIONS

Japanese Office Action corresponding to Korean Patent Application No. 2003-82391 issued on Nov. 14, 2006.

Japanese Office action corresponding to Japanese Patent Application No. JP2004-335159, issued on Mar. 6, 2007.

* cited by examiner

ELECTROLUMINESCENT DISPLAY

CLAIM OF PRIORITY

This application makes reference to, incorporates the same herein, and claims all benefits accruing under 35 U.S.C. §119 from an application earlier filed in the Korean Intellectual Property Office on 19 Nov. 2003 and there duly assigned Serial No. 2003-82391.

BACKGROUND OF THE INVENTION

1. Field of the Invention

The present invention relates to an electroluminescent display and, more particularly, to an electroluminescent display in which an electromagnetic shield is adapted to shield a first power supply voltage line to prevent the occurrence of noise or the like on the power supply voltage due to internal or external electromagnetic waves.

2. Description of the Related Art

In recent years, various flat panel displays have been developed which are capable of reducing weight and volume which are disadvantages of a Cathode Ray Tube (CRT). Such flat panel displays include liquid crystal displays, field emission displays, plasma display panels, electroluminescent displays, and the like.

Among these displays, the electroluminescent display uses carriers, such as electrons and holes, to excite a fluorescent material to display images or video so that it may be driven by a low direct voltage and has a faster response speed. For these reasons, the electroluminescent display has been in the spotlight as the next generation display and research on new electroluminescent display products have accelerated in recent years.

An electroluminescent display can be classified into a passive matrix type and an active matrix type. The active matrix electroluminescent display has an active switching device arranged in each pixel. A voltage or current is supplied to drive each emitting device in response to the image data of the pixel.

An electroluminescent display includes a first upper power supply voltage line, a first lower power supply voltage line, a second power supply voltage line, a scan driver, a data driver, a first active power supply voltage line, and a pixel region.

The electroluminescent display includes the scan driver supplying a selection signal, the data driver supplying a data signal, the pixel region emitting light in response to the selection signal and the data signal respectively supplied from the scan driver and the data driver, the first upper and lower power supply voltage lines delivering first power supply voltages, the second power supply line delivering a second power supply voltage, and the first active power supply voltage line supplying the power supply voltages from the first power supply voltage lines and the second power supply voltage from the second power supply voltage line to the pixel region.

When the selection signal and the data signal are respectively supplied from the scan driver and the data driver to the pixel region, switching transistors drive transistors of the pixel region, and the first and second power supply voltages are supplied to the pixel region via the first power supply voltage lines and the second power supply voltage line so that each pixel of the pixel region emits light. Each of the first power supply voltages is opposite to that of the second power supply voltage.

However, the electroluminescent display described above has a problem that the waveform of the power supply voltage is distorted due to internally or externally supplied electromagnetic waves. That is, the power supply voltages delivered via the first upper and lower power supply voltage lines have noise which results from externally or internally supplied electromagnetic waves, thereby resulting in non-uniform brightness.

SUMMARY OF THE INVENTION

The present invention, therefore, solves aforementioned problems associated with the electroluminescent display described above by providing an electroluminescent display having an electromagnetic shield arranged in parallel with the first power supply voltage lines. A specific voltage is supplied to the electromagnetic shield to attract the electromagnetic waves so as to shield the first power supply voltage lines from electromagnetic waves that would otherwise affect the power supply voltage.

In an exemplary embodiment of the present invention, an electroluminescent display includes: a pixel region including devices arranged therein and adapted to emit light in response to a data signal; a scan driver adapted to supply a switching signal to a gate electrode of a first switching device; a data driver adapted to supply data information to a source electrode of the first switching device; a conductive power supply line adapted to supply a first power supply voltage to the pixel region, and an electromagnetic shield adapted to shield electromagnetic waves having electric or magnetic field characteristics.

The electroluminescent display further preferably comprises a shielding voltage generator adapted to supply a voltage to the electromagnetic shield.

The electromagnetic shield is preferably adapted to generate a second power supply voltage.

The second power supply voltage preferably has a polarity opposite to that of the first power supply voltage.

The electromagnetic shield preferably comprises a conductive interconnection line arranged in parallel with the first power supply voltage line.

In another exemplary embodiment of the present invention, an electroluminescent display includes: a pixel region including devices arranged therein and adapted to emit light in response to a data signal; a scan driver adapted to supply a switching signal to a gate electrode of a first switching device; a data driver adapted to supply data information to a source electrode of the first switching device; a conductive power supply line adapted to supply a first power supply voltage to the pixel region, and at least one metal line arranged in parallel with the first power supply voltage line.

The at least one metal line is preferably arranged inside the first power supply voltage line.

The at least one metal line is alternatively preferably arranged outside the first power supply voltage line.

The at least one metal line alternatively preferably comprises metal lines respectively arranged inside and outside the first power supply voltage line.

The electroluminescent display further preferably comprises a shielding voltage generator adapted to supply a voltage to the at least one metal line.

The shielding voltage generator is preferably adapted to supply a second power supply voltage having a polarity opposite to that of the first power supply voltage to the at least one metal line.

In yet another exemplary embodiment of the present invention, an electroluminescent display includes: a pixel region including devices arranged therein and adapted to emit light in response to a data signal; a scan driver adapted to supply a switching signal to a gate electrode of a first switching device; a data driver adapted to supply data information to a source electrode of the first switching device; a conductive power supply line adapted to supply a first power supply voltage to the pixel region, and a metal line arranged parallel with the first power supply voltage line and adapted to be connected to a ground terminal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
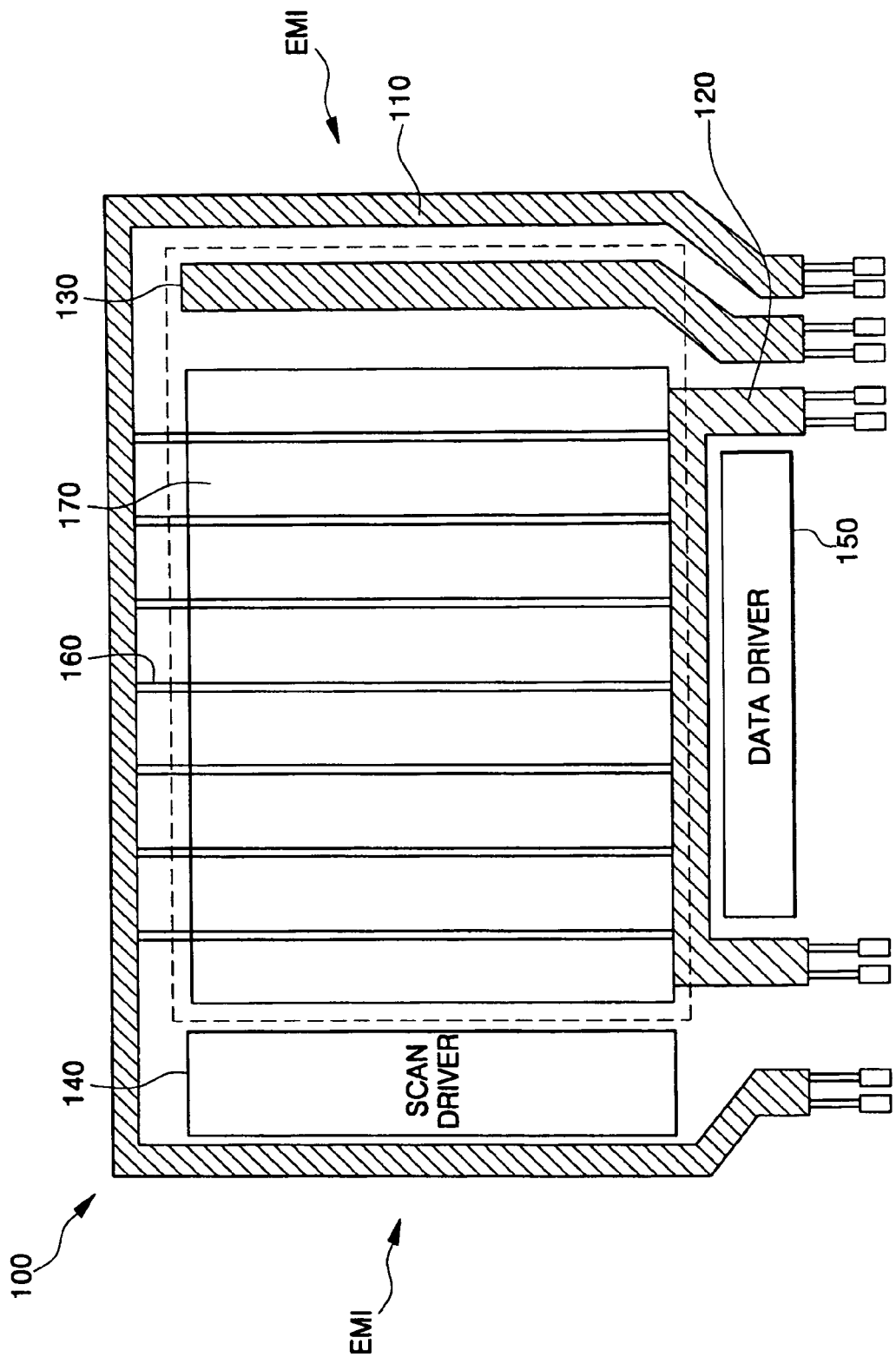
FIG. 1 is a plan view of an electroluminescent display.

FIG. 1 is a plan view of an active matrix type electroluminescent display.

An electroluminescent display 100 includes a first upper power supply voltage line 110, a first lower power supply voltage line 120, a second power supply voltage line 130, a scan driver 140, a data driver 150, a first active power supply voltage line 160, and a pixel region 170.

As shown in the FIG. 1, the electroluminescent display 100 includes the scan driver 140 supplying a selection signal, the data driver 150 supplying a data signal, the pixel region 170 emitting light in response to the selection signal and the data signal respectively supplied from the scan driver 140 and the data driver 150, the first upper and lower power supply voltage lines 110 and 120 delivering first power supply voltages, the second power supply line 130 delivering a second power supply voltage, and the first active power supply voltage line 160 supplying the power supply voltages from the first power supply voltage lines 110 and 120 and the second power supply voltage from the second power supply voltage line 130 to the pixel region 170.

When the selection signal and the data signal are respectively supplied from the scan driver 140 and the data driver 150 to the pixel region 170, switching transistors drive transistors (not shown) of the pixel region 170, and the first and second power supply voltages are supplied to the pixel region 170 via the first power supply voltage lines 110 and 120 and the second power supply voltage line 130 so that each pixel of the pixel region 170 emits light. Each of the first power supply voltages is opposite to that of the second power supply voltage.

The present invention will now be described more fully hereinafter with reference to the accompanying drawings, in which exemplary embodiments of the present invention are shown.

Figure 2:
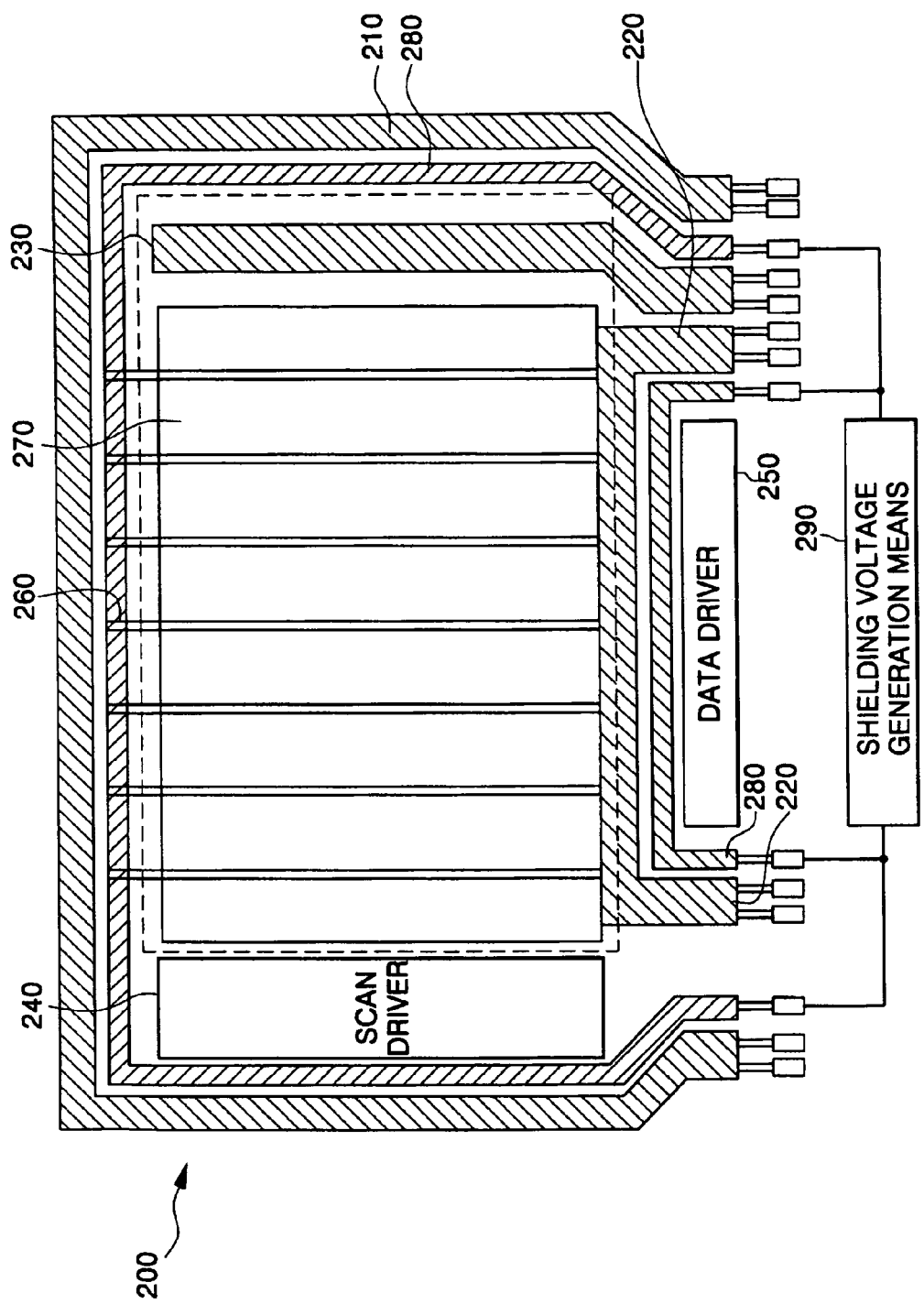
FIG. 2 is a plan view of an electroluminescent display in accordance with a first embodiment of the present invention.

FIG. 2 is a plan view of an electroluminescent display in accordance with a first embodiment of the present invention.

An electroluminescent display 200 includes a first upper power supply line 210, a first lower power supply voltage line 220, a second power supply voltage line 230, a scan driver 240, a data driver 250, a first active power supply voltage line 260, a pixel region 270, a metal line 280, and a shielding voltage generator 290.

As shown in FIG. 2, the electroluminescent display 200 according to an embodiment of the present invention includes the scan driver 240, the data driver 250, the pixel region 270 emitting light in response to a selection signal and a data signal respectively supplied by the scan driver 240 and the data driver 250, the first upper and lower power supply voltage lines 210 and 220 delivering first power supply voltages, the first active power supply voltage line 260 supplying the power supply voltages from the first power supply voltage lines 210 and 220 to the pixel region 270, the second power supply voltage line 230 supplying a second power supply voltage to the pixel region 270, the metal line 280 arranged in parallel to the first power supply voltage lines 210 and 220 to shield electromagnetic waves, and the shielding voltage generator 290 supplying a shielding voltage to the metal line 280.

When the selection signal and the data signal are respectively supplied by the scan driver 240 and the data driver 250 to the pixel region 270, switching and drive transistors (not shown) of the pixel region 270 are turned on. As the drive transistor of the pixel region 270 is turned on, the power supply voltages supplied to the first upper and lower power supply voltage lines 210 and 220 are supplied to the pixel region 270 via the first active power supply voltage line 260 so that the pixel region 270 emits light.

In addition, the shielding voltage generator 290 supplies a specific voltage to the metal line 280 so that a specific current flows through the metal line 280 arranged in parallel to each of the first upper and lower power supply voltage lines 210 and 220. The specific voltage supplied to the metal line 280 preferably has a polarity opposite to that of each first power supply voltage.

Figure 3:
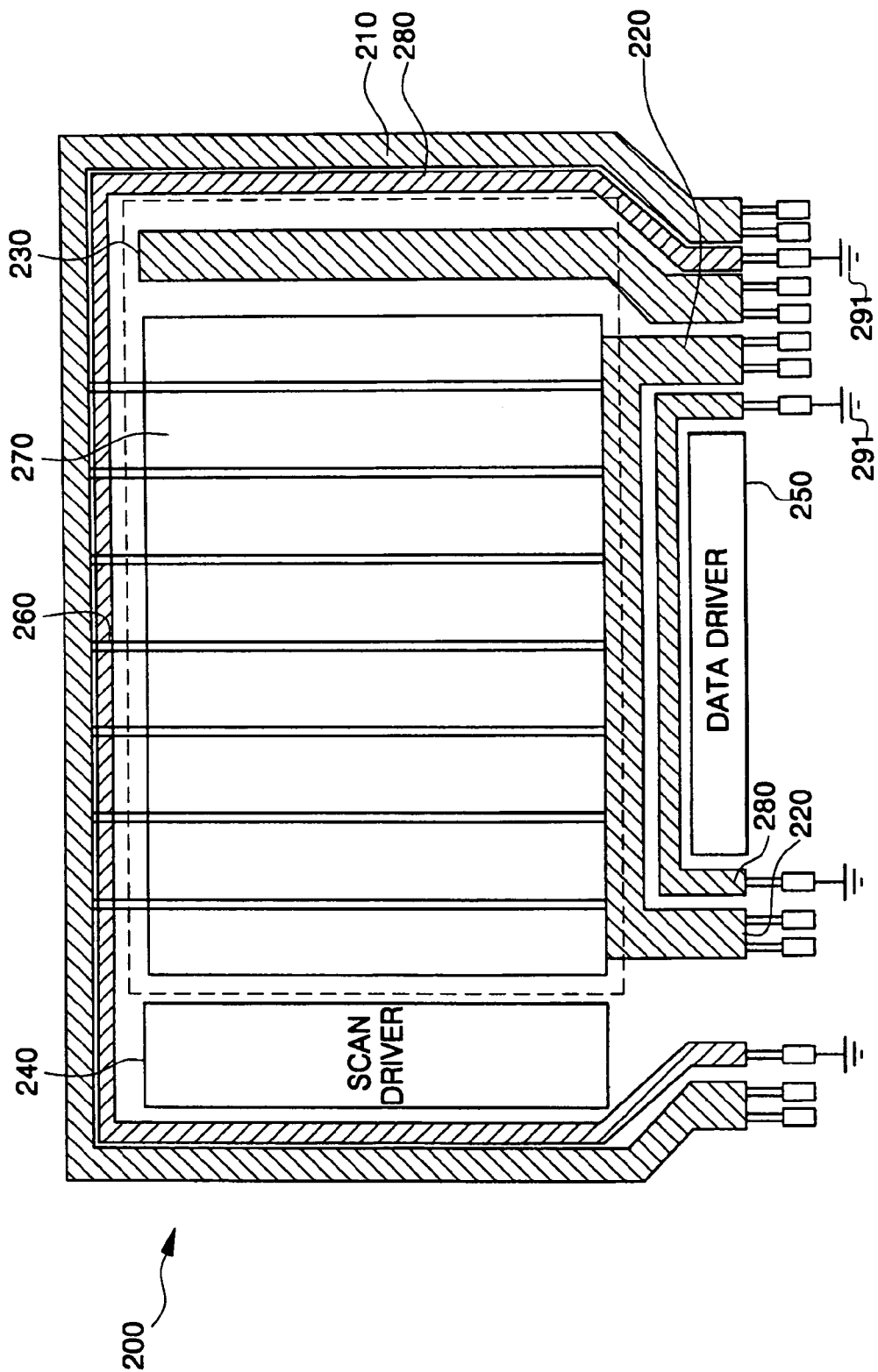
FIG. 3 is a plan view of an electroluminescent display in accordance with a second embodiment of the present invention.

In addition, the metal line 280 and the first power supply voltage line 210 are spaced apart from each other by a constant interval to be parallel to each other as shown in FIGS. 2 and 3, However, the metal line 280 and the first power supply voltage line 210 can be isolated from each other by a separate insulator interposed therebetween.

As a result, when electromagnetic waves from an external source and having magnetic or electric field characteristics are supplied to the first power supply voltage lines 210 and 220, the electromagnetic waves are shielded by the metal line 280 arranged in parallel to the first power supply voltage lines 210 and 220. That is, the voltage supplied to the metal line 280 has a polarity opposite to that of the first power supply voltage so that the electromagnetic waves are attracted by the metal line 280 due to electrical characteristics which flow from positive to negative or from negative to positive. As a result, the power supply voltage is not affected by the electromagnetic waves.

FIG. 3 is a plan view of an electroluminescent display in accordance with a second embodiment of the present invention.

As shown in FIG. 3, another embodiment of the present invention has ground terminals 291, each of which being connected to the metal line 280. Accordingly, the electromagnetic waves supplied to the first power supply voltage lines 210 and 220 are attracted by the metal line 280 to be grounded so that the power supply voltages are shielded from the electromagnetic waves.

Figure 4:
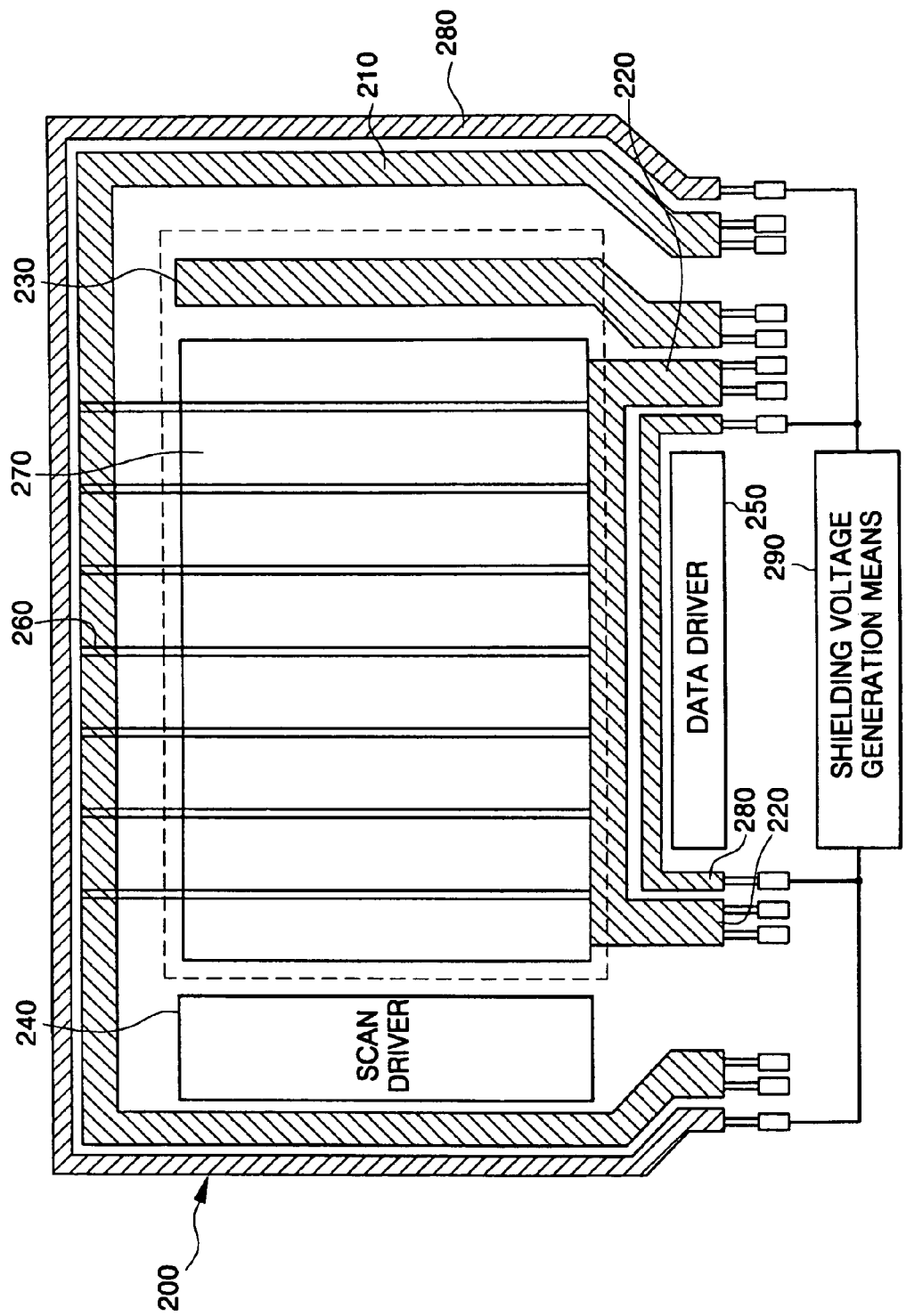
FIG. 4 is a plan view of an electroluminescent display in accordance with a third embodiment of the present invention.

FIG. 4 is a plan view of an electroluminescent display in accordance with a third embodiment of the present invention.

As described above, the metal line 280 is arranged in the first upper power supply voltage line 210 as in the first embodiment. However, in the third embodiment, the metal line 280 can also be arranged outside the first upper power supply voltage line 210.

That is, the metal line 280 is arranged outside the first upper power supply voltage line 210 so as to be spaced apart or insulated from the first upper power supply voltage line 210 by a constant interval or by an insulator (not shown) respectively, so that the electromagnetic waves from an external source can be shielded.

Figure 5:
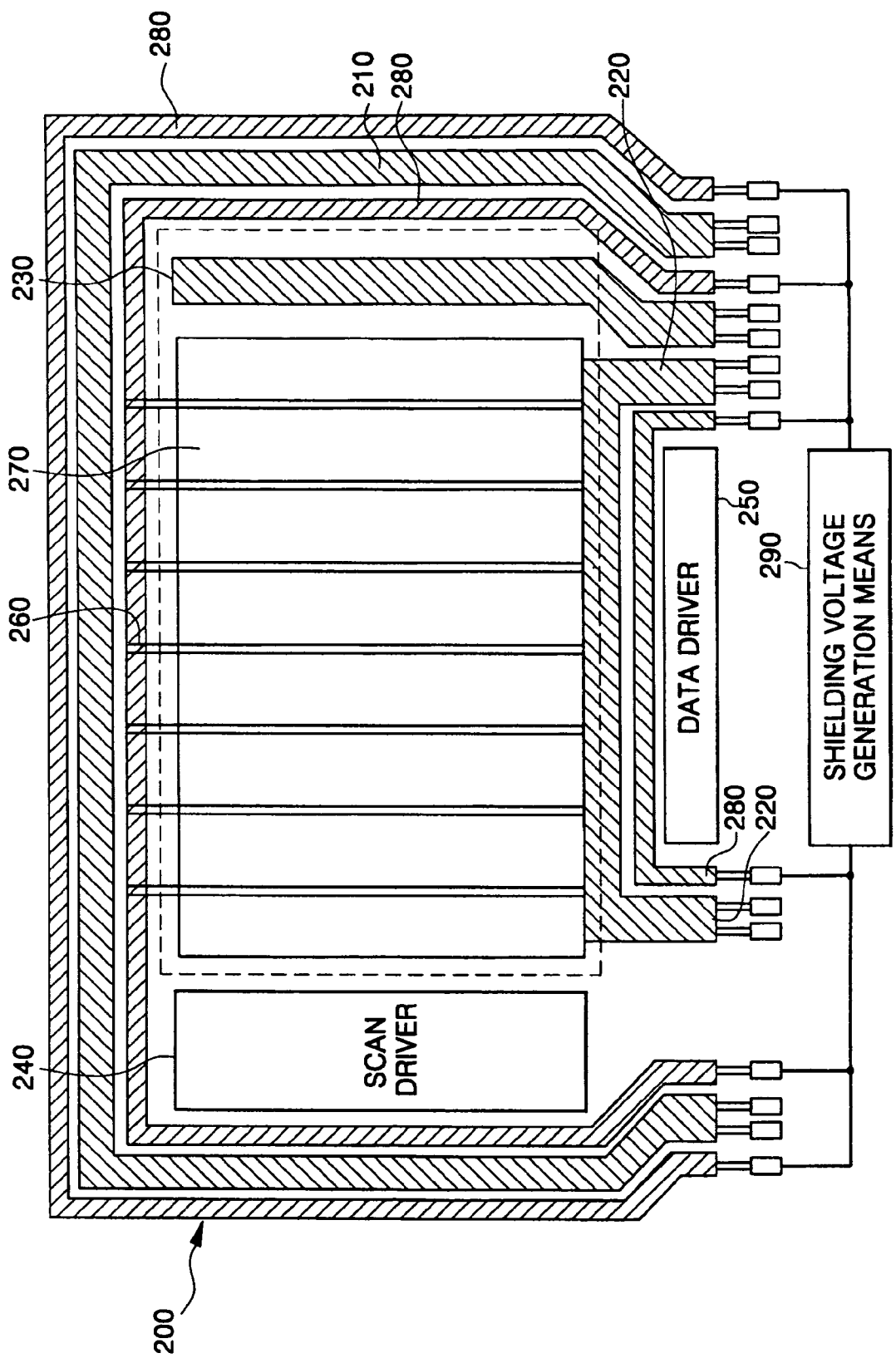
FIG. 5 is a plan view of an electroluminescent display in accordance with a fourth embodiment of the present invention.

FIG. 5 is a plan view of an electroluminescent display in accordance with a fourth embodiment of the present invention.

The metal lines 280 are arranged inside and outside of the first upper power supply voltage line 210 to shield the electromagnetic waves from an external source. That is, a specific voltage is supplied to the metal lines 280 arranged inside and outside of the first upper power supply voltage line 210 so that the electromagnetic waves from the external source can be shielded.

According to the present invention, as mentioned above, the electromagnetic waves can be shielded by the metal line arranged parallel to the first power supply voltage lines so that noise of the power supply voltage does not occur, which allows non-uniformity in brightness due to the electromagnetic waves to be improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An electroluminescent display comprising:
   a pixel region including devices arranged therein and adapted to emit light in response to a data signal;
   a scan driver adapted to supply a switching signal to a gate electrode of a first switching device;
   a data driver adapted to supply data information to a source electrode of the first switching device;
   a conductive power supply line adapted to supply a first DC power supply voltage to the pixel region,
   an electromagnetic shield adapted to shield electromagnetic waves having electric and magnetic field characteristics; and
   a shielding voltage generator adapted to supply a voltage to the electromagnetic shield.

2. The electroluminescent display of claim 1, wherein the electromagnetic shield is adapted to generate a second DC power supply voltage.

3. The electroluminescent display of claim 2, wherein the second power supply voltage has a polarity opposite to that of the first DC power supply voltage.

4. The electroluminescent display of claim 2, wherein the electromagnetic shield comprises a conductive interconnection line arranged in parallel with the first DC power supply voltage line.

5. An electroluminescent display comprising:
   a pixel region including devices arranged therein and adapted to emit light in response to a data signal;
   a scan driver adapted to supply a switching signal to a gate electrode of a first switching device;
   a data driver adapted to supply data information to a source electrode of the first switching device;
   a conductive power supply line adapted to supply a first DC power supply voltage to the pixel region;
   at least one metal line arranged in parallel with the first DC power supply voltage line and adapted to shield electromagnetic waves having electric and magnetic field characteristics; and
   a shielding voltage generator adapted to supply a voltage to the at least one metal line.

6. The electroluminescent display of claim 5, wherein the at least one metal line is arranged inside the first DC power supply voltage line.

7. The electroluminescent display of claim 5, wherein the at least one metal line is arranged outside the first DC power supply voltage line.

8. The electroluminescent display of claim 5, wherein the at least one metal line comprises metal lines respectively arranged inside and outside the first DC power supply voltage line.

9. The electroluminescent display of claim 5, wherein the shielding voltage generator is adapted to supply a second DC power supply voltage having a polarity opposite to that of the first DC power supply voltage to the at least one metal line.

10. An electroluminescent display comprising:
    a pixel region including devices arranged therein and adapted to emit light in response to a data signal;
    a scan driver adapted to supply a switching signal to a gate electrode of a first switching device;
    a data driver adapted to supply data information to a source electrode of the first switching device;
    a conductive power supply line adapted to supply a first DC power supply voltage to the pixel region, and
    a metal line arranged parallel with the first DC power supply voltage line and adapted to be connected to a ground terminal, the metal line adapted to shield electromagnetic waves having electric and magnetic field characteristics.

* * * * *